United States Patent [19]
Wu

[11] Patent Number: 6,166,325
[45] Date of Patent: Dec. 26, 2000

[54] SHIELD PANEL STRUCTURE

[75] Inventor: Kun-Tsan Wu, Tu-Chen, Taiwan

[73] Assignee: Hon Hai Precision Ind. Co., Ltd., Taipei Hsien, Taiwan

[21] Appl. No.: 09/342,274

[22] Filed: Jun. 29, 1999

[30] Foreign Application Priority Data

Dec. 18, 1998 [TW] Taiwan ................................. 87221142

[51] Int. Cl.⁷ .................................................... H05K 9/00
[52] U.S. Cl. .................................... 174/35 GC; 174/52.1; 361/686; 361/809; 361/810; 361/801; 361/816
[58] Field of Search .................................... 361/686, 816, 361/752, 801, 809, 810, 818; 174/52.1, 35 R, 35 GC

[56] References Cited

U.S. PATENT DOCUMENTS

| | | | |
|---|---|---|---|
| 5,191,544 | 3/1993 | Benck et al. ............................. | 364/708 |
| 5,347,430 | 9/1994 | Curlee et al. ............................ | 361/816 |
| 5,564,930 | 10/1996 | Yu ............................................. | 439/61 |
| 6,023,415 | 2/2000 | Mayer et al. ............................ | 361/816 |
| 6,047,172 | 4/2000 | Babineau et al. ....................... | 455/300 |

*Primary Examiner*—Kristine Kincaid
*Assistant Examiner*—Hung V Ngo
*Attorney, Agent, or Firm*—Wei Te Chung

[57] ABSTRACT

A shield panel includes a substantially flat plate adapted to be snugly fit into an opening defined in a casing of an electronic device for shielding a circuit board inside the casing. Two board support arms extend from the flat plate. Each board support arm defines an elongate slot extending in a direction substantially normal to the flat plate having a distal end, a proximal end, and two edges extending between the ends for receiving and guiding an edge of the circuit board from the distal end to the proximal end. One of the edges of the slot is declined with respect to the other edge for accommodating a variation of an angle formed between the flat plate and the circuit board.

5 Claims, 6 Drawing Sheets

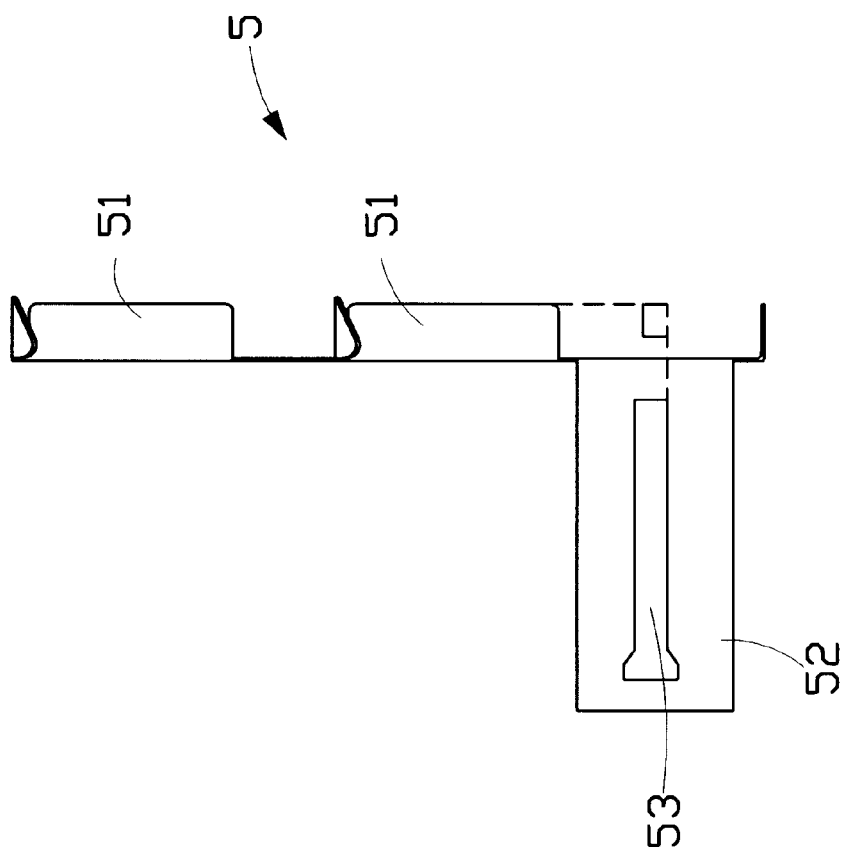

SHIELD PANEL STRUCTURE

BACKGROUND OF THE INVENTION

1. Field of the Invention

The present invention generally relates to a shield panel of an electronic device to which a circuit board is perpendicularly mounted to be shielded thereby, and in particular to a shield panel structure that allows variation of an angle between the panel and the circuit board.

2. The Prior Art

A shield panel for being received and retained in an opening defined in a casing of an electronic device to electrically shield a circuit board disposed inside the casing and to provide electromagnetic interference (EMI) protection is well-known in the electronics field. FIG. 6 of the attached drawings shows an example of the conventional shield panel. The conventional shield panel, designated by reference numeral 5, comprises a substantially flat plate (not labeled) sized to snugly fit into an opening defined in a casing of an electronic device (not shown). The shield panel 5 has side flanges 51 perpendicularly extending from the flat plate for resiliently engaging with the casing thereby retaining the shield panel 5 in the openings. The shield panel 5 comprises two opposite board support arms 52 extending from the flat plate for supporting a circuit board disposed inside the casing. Each board support arm 52 defines an elongate slot 53 into which an edge of the circuit board is received and thus supported thereby.

In general, the circuit board is arranged substantially horizontal, while the shield panel 5 is substantially vertical for facilitating alignment with the opening of the casing. A right angle is formed between the shield panel 5 and the circuit board. Thus, the slot 53 extends substantially normal to the flat plate of the shield panel 5 for maintaining the right angle between the flat plate of the shield panel 5 and the circuit board.

However, due to manufacturing and assembling tolerances, the circuit board may form an angle with respect to the horizontal whereby the shield panel 5 cannot maintain the alignment thereof with the opening of the casing. A gap may thus be formed between the shield panel 5 and the casing resulting in deterioration of the EMI protection properties of the shield panel 5.

It is thus desired to have a shield panel structure which accommodates an angle of variation between the panel and a circuit board thereby overcoming the problem discussed above.

SUMMARY OF THE INVENTION

Accordingly, an object of the present invention is to provide a shield panel that allows a variation of an angle formed between the shield panel and a circuit board.

Another object of the present invention is to provide a shield panel for properly aligning the panel with respect to an opening of a casing thereby maintaining EMI protection properties of the shield panel.

To achieve the above objects, a shield panel in accordance with the present invention comprises a substantially flat plate adapted to be snugly fit into an opening defined in a casing of an electronic device for shielding a circuit board inside the casing. Two board support arms extend from the flat plate. Each board support arm defines an elongate slot extending in a direction substantially normal to the flat plate having a distal end, a proximal end, and two edges extending between the ends for receiving and guiding an edge of the circuit board from the distal end to the proximal end. At least one of the edges of the slot is inclined with respect to the other edge for accommodating a variation of an angle formed between the flat plate and the circuit board.

BRIEF DESCRIPTION OF THE DRAWINGS

The present invention will be apparent to those skilled in the art by reading the following description of a preferred embodiment thereof, with reference to the accompanying drawings, in which:

FIG. 6 is a side elevational view of a conventional shield panel.

DETAILED DESCRIPTION OF THE PREFERRED EMBODIMENT

Figure 1:
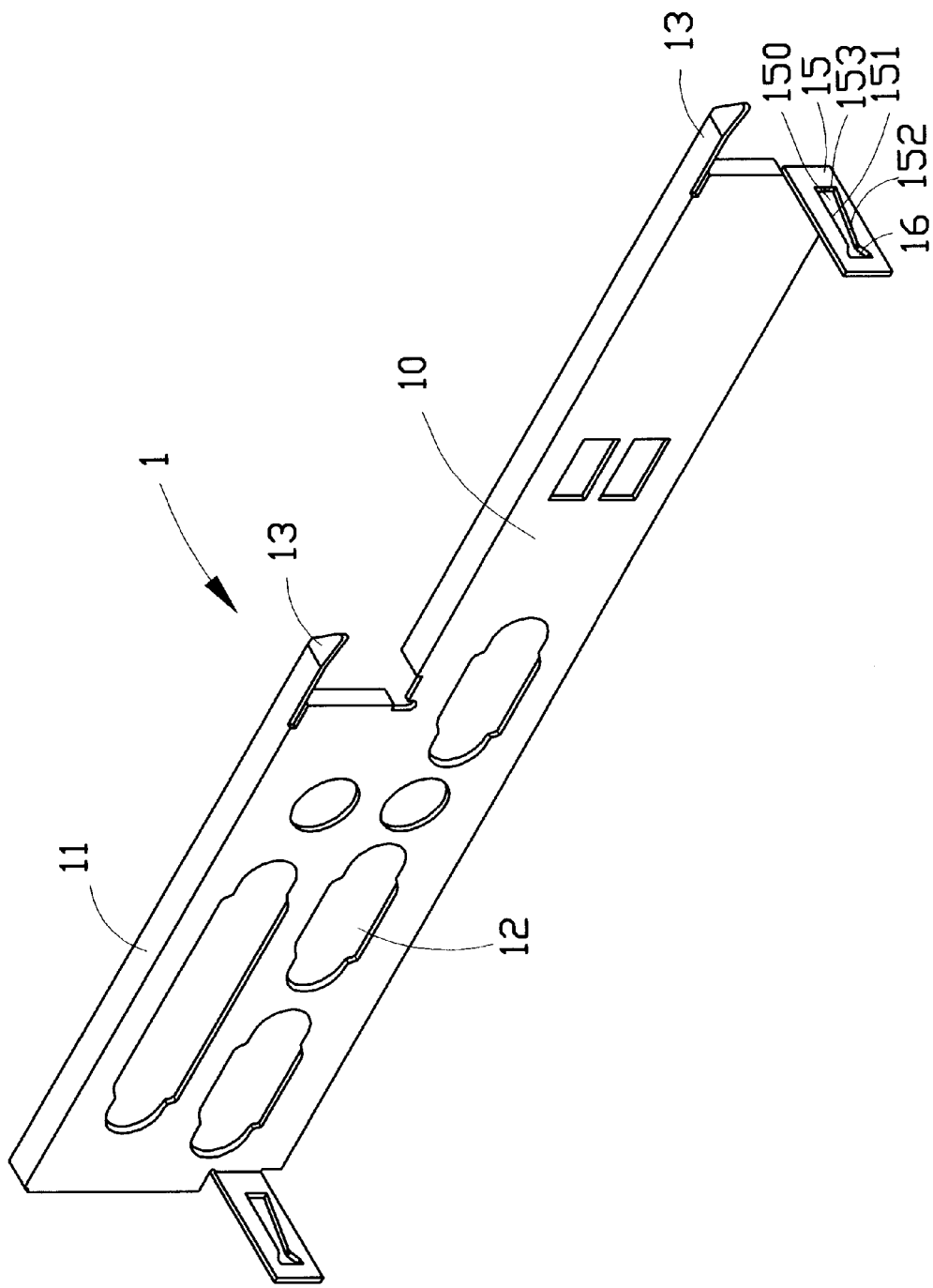
FIG. 1 is a perspective view of a shield panel constructed in accordance with the present invention.
Figure 2:
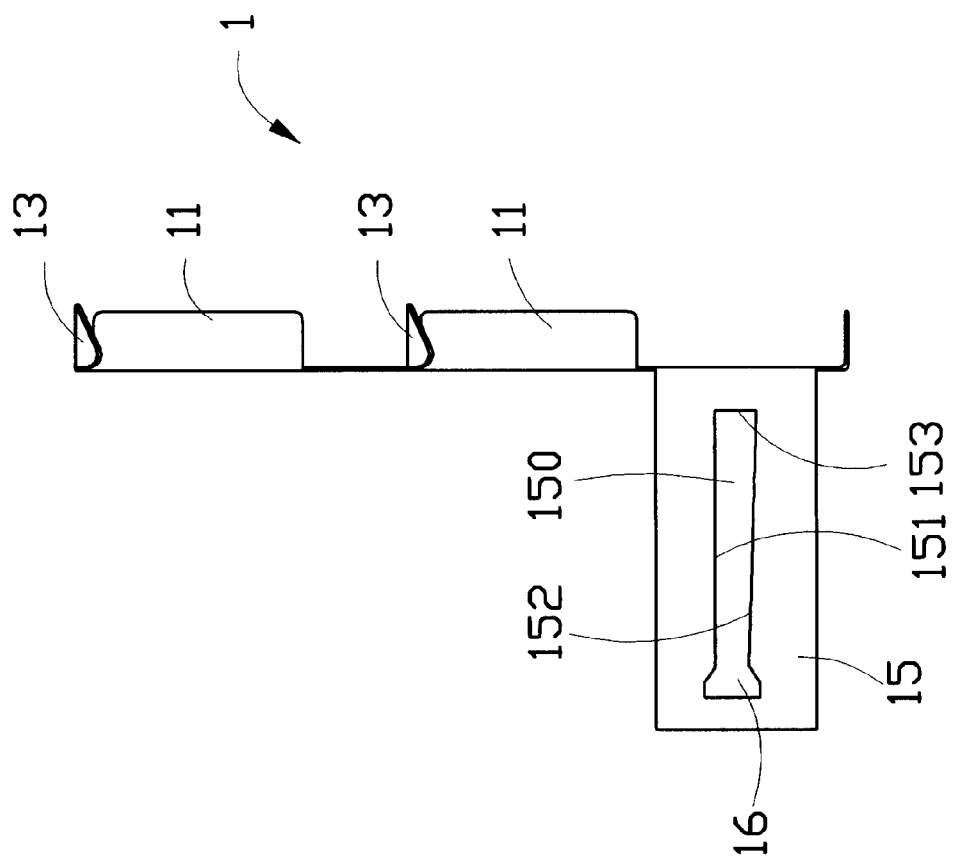
FIG. 2 is a side elevational view of the shield panel of the present invention.

Referring to the drawings and in particular to FIGS. 1 and 2, a shield panel 1 constructed in accordance with the present invention is shown, the shield panel 1 comprises a substantially flat plate 10 sized to fit into an opening defined in a casing of an electronic device (not shown), such as a computer. The shield panel 1 has side flanges 11 extending from the flat plate 10 for mechanically and electrically engaging with the casing thereby retaining the shield panel 1 in the opening of the casing and providing electrical grounding for EMI protection. The shield panel 1 has retaining tabs 13 extending from the side flanges 11 and engaging with corresponding portions of the casing for more securely retaining the shield panel 1 in the opening of the casing and providing enhanced electrical shielding properties. The shield panel 1 defines a number of openings 12 for accommodating different connectors (not shown) mounted on a circuit board 3 (FIGS. 3, 4 and 5).

The shield panel 1 has two opposite board support arms 15 substantially normal to the flat plate 10. Each board support arm 15 defines an elongate slot 150 therein. The slot 150 has a proximal end 153 and a distal end defining an expanded opening 16. The slot 150 has a substantially straight upper edge 151 which is substantially normal to the flat plate 10 and an declined lower edge 152 which diverges from the upper edge 151 in a direction toward the proximal end 153.

Figure 3:
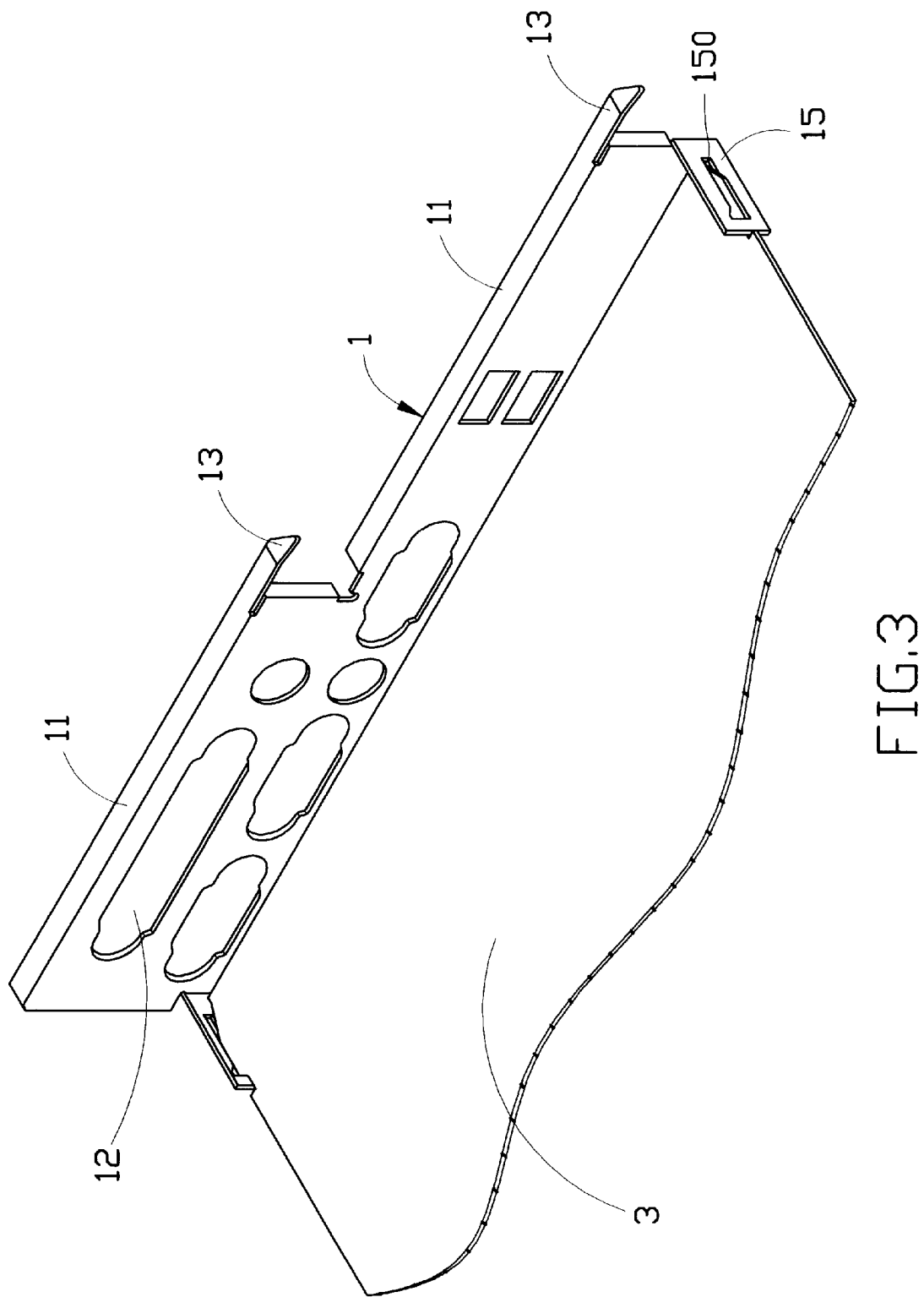
FIG. 3 is a perspective view of the shield panel to which a circuit board is mounted.

As shown in FIG. 3, the expanded opening 16 formed at the distal end of each slot 150 facilitates insertion of an edge of the circuit board 3. The edge of the circuit board 3 is guided by and moved along the slot 150 of the board support arm 15 toward the shield panel 1.

Figure 4:
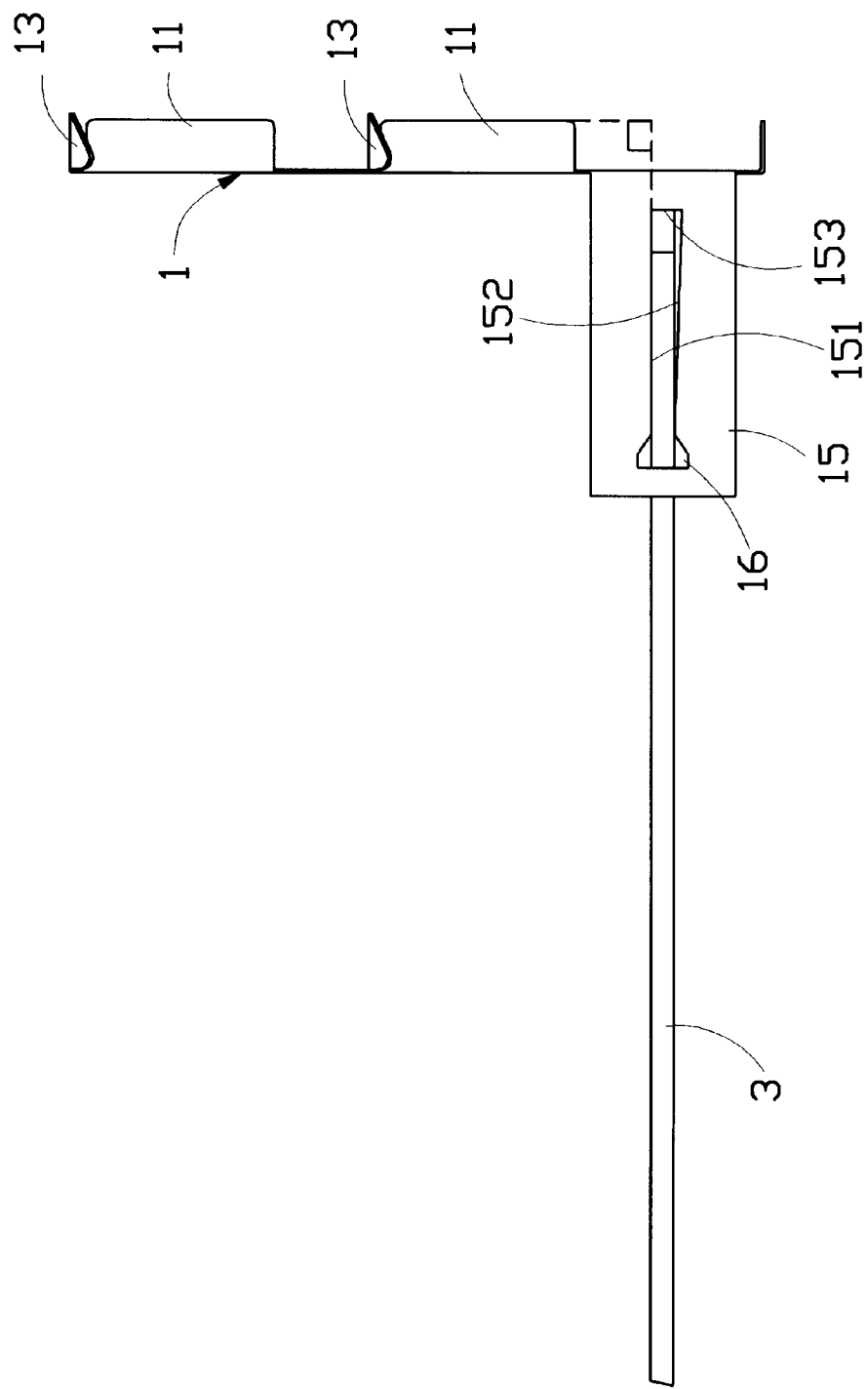
FIG. 4 is a side elevational view of FIG. 3 wherein a right angle is formed between the circuit board and the shield panel.
Figure 5:
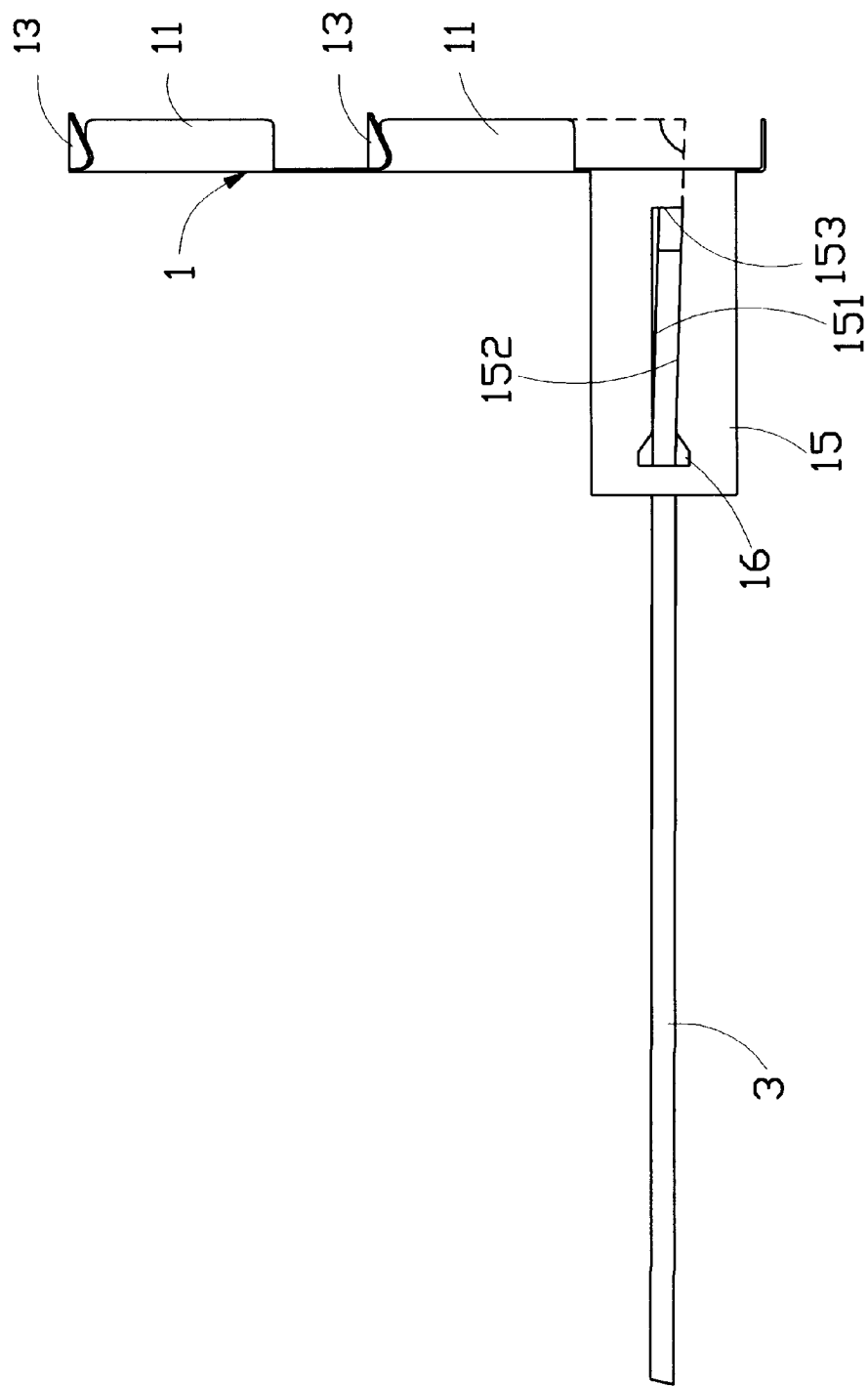
FIG. 5 is also a side elevational view of FIG. 3, wherein an angle of less than 90 degrees is formed between the circuit board and the shield panel.

When an angle between the circuit board 3 which is secured to the casing and the panel shield 1 is substantially 90 degrees, the circuit board 3 abuts against the straight upper edge 151 of the slot 150 as shown in FIG. 4.

When the angle between the circuit board 3 and the shield panel 1 is less than 90 degrees, the divergence of the lower edge 152 of the slot 150 accommodates the variation of the angle thereby allowing the circuit board 3 to be securely retained in the slot 150 without causing a deformation or misalignment of the shield panel 1 with respect to the casing of the electronic device as shown in FIG. 5. Thus, even though an angle smaller than 90 degrees is maintained between the circuit board 3 and the shield panel 1, the shield panel 1 may still be properly aligned with respect to the opening of the casing.

It is noted that the slot 150 forms a narrow waist section, adjacent to the opening 16, which is dimensioned to comply with the thickness of the circuit board 3 for retainably sandwiching the circuit board 3 therein. Under this situation, the circuit board 3 may retainably adjustably pivotably positionable relative to the shield panel 1 about such a narrow waist section for allowing alignment between the openings 12 of the shield panel 1 and the openings of the casing.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A shield panel comprising a substantially flat plate adapted to be snugly fit into an opening defined in a casing of an electronic device for shielding a circuit board inside the casing, two board support arms extending from the flat plate, each board support arm defining an elongate slot having a distal end, a proximal end, and two edges extending therebetween for receiving and guiding an edge of the circuit board from the distal end to the proximal end, a first of said edges of the slot being substantially normal to the flat plate of the shield panel and a second of said edges being declined and diverging from the first edge in a direction toward the proximal end.

2. The shield panel as claimed in claim 1, wherein an expanded opening is defined in each board support arm at the distal end of the slot thereof.

3. A shield panel comprising a substantially flat plate adapted to be snugly fit into an opening defined in a casing of an electronic device for shielding a circuit board inside the casing, two board support arms extending from the flat plate, each board support arm defining an elongate slot extending in a direction substantially normal to the flat plate, each slot having a distal end, a proximal end, and two edges extending between the ends for receiving and guiding an edge of the circuit board from the distal end to the proximal end, one of the edges of the slot being declined with respect to the flat plate of the shield panel.

4. The shield panel as claimed in claim 3, wherein each board support arm defines an expanded opening at the distal end of the slot thereof.

5. A shield assembly comprising a substantially flat plate with side flanges extending forward and perpendicularly therefrom, a plurality of openings formed in said plate, two board support arms extending rearward and perpendicularly from two opposite ends of the plate, each of said board support arms defining a slot with a narrow waist section, and a circuit board including two side edge portions adapted to be received within the corresponding slots, respectively, wherein the dimension of the waist section complies with a thickness of the circuit board so that said circuit board can be retainably adjustably pivotably positionable relative to the shield panel about said narrow waist section.

\* \* \* \* \*